United States Patent
Bansal et al.

(10) Patent No.: US 8,139,400 B2
(45) Date of Patent: Mar. 20, 2012

(54) ENHANCED STATIC RANDOM ACCESS MEMORY STABILITY USING ASYMMETRIC ACCESS TRANSISTORS AND DESIGN STRUCTURE FOR SAME

(75) Inventors: Aditya Bansal, White Plains, NY (US);
Ching-Te K. Chuang, South Salem, NY (US); Jae-Joon Kim, Austin, TX (US);
Shih-Hsien Lo, Mount Kisco, NY (US);
Rahul M. Rao, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 12/017,404

(22) Filed: Jan. 22, 2008

(65) Prior Publication Data
US 2009/0185409 A1    Jul. 23, 2009

(51) Int. Cl.
G11C 11/00 (2006.01)
H01L 29/02 (2006.01)
(52) U.S. Cl. .................. 365/154; 365/156; 257/404
(58) Field of Classification Search .............. 365/154, 365/156, 189.09; 257/404
See application file for complete search history.

(56) References Cited

U.S. PATENT DOCUMENTS

| | | | |
|---|---|---|---|
| 5,353,245 A | 10/1994 | Lee et al. | |
| 5,363,328 A | 11/1994 | Browning, III et al. | |
| 5,751,640 A | 5/1998 | Gil | |
| 5,956,269 A | 9/1999 | Ouyang et al. | |
| 6,191,460 B1 | 2/2001 | Choi et al. | |
| 6,466,489 B1 * | 10/2002 | Ieong et al. | 365/189.09 |
| 6,751,111 B2 * | 6/2004 | Foss et al. | 365/154 |
| 6,898,111 B2 * | 5/2005 | Yamauchi | 365/154 |
| 7,046,544 B1 | 5/2006 | Shimanek | |
| 7,136,297 B2 * | 11/2006 | Tsujimura et al. | 365/154 |
| 7,313,012 B2 * | 12/2007 | Chuang et al. | 365/154 |
| 7,362,606 B2 * | 4/2008 | Chuang et al. | 365/154 |
| 7,492,628 B2 * | 2/2009 | Chuang et al. | 365/154 |
| 7,511,989 B2 * | 3/2009 | Thomas et al. | 365/154 |
| 2003/0173625 A1 | 9/2003 | Choi | |
| 2004/0047176 A1 | 3/2004 | Alvandpour et al. | |
| 2005/0226031 A1 | 10/2005 | Najm et al. | |

(Continued)

OTHER PUBLICATIONS

Buti. T. et al A New Asymmetrical Halo Source GOLD Drain (HS-GOLD) Deep Sub-Half-Micrometer n-MOSFET Design for Relaibility and Performance IEEE Transactions on Electron Devices vol. 38, No. 8 Aug. 1991.

(Continued)

*Primary Examiner* — Trong Phan
(74) *Attorney, Agent, or Firm* — Ryan, Mason & Lewis, LLP

(57) ABSTRACT

A memory circuit includes a plurality of bit line structures (each including a true and a complementary bit line), a plurality of word line structures intersecting the plurality of bit line structures to form a plurality of cell locations and a plurality of cells located at the plurality of cell locations. Each of the cells includes a logical storage element, a first access transistor selectively coupling a given one of the true bit lines to the logical storage element, and a second access transistor selectively coupling a corresponding given one of the complementary bit lines to the logical storage element. One or both of the first and second access transistors are configured with asymmetric current characteristics to enable independent enhancement of READ and WRITE margins. Also included within the 6-T scope are one or more design structures embodied in a machine readable medium, comprising circuits as set forth herein.

15 Claims, 6 Drawing Sheets

U.S. PATENT DOCUMENTS

2006/0250880 A1 11/2006 Ramaraju et al.
2007/0201261 A1 8/2007 Chuang et al.
2007/0236982 A1 10/2007 Chuang et al.

OTHER PUBLICATIONS

Odanka, S et al "Potential Design and Transport Property of 0.1-μm MOSFET with Asymmetric Channel Profile" IEEE Transactions on Electron Devices vol. 44, No. 4, Apr. 1997.

Ohzone, T et al. Influence of Asymmetric/Symmetric Source/Drain Region on Asymmetry and Mismatch of CMOSFET's and Circuit Performance IEEE Transations on Electron Devices vol. 45 No. 2 Feb. 1998.

Akturk, A. et al. "Faster CMOS Inverter Switching Obtained with Channel Engineered Asymmetrical Halo Implanted MOSFETs" Semiconductor Device Research Symposium 2001 International 2001 pp. 118-121.

Bansal, A. et al "Asymmetric Halo CMOSFET to Reduce Static Power Dissipation With Improved Performance" IEEE Transactions on Electron Devices, vol. 52, No. 3, Mar. 2005.

Jain, S K et al. "A Low Leakage and SNM Free SRAM cell Design in Deep Sub Micron CMOS Technology.," IEEE VLSID 2006.

\* cited by examiner

ASYMMETRIC MOSFET

ENHANCED STATIC RANDOM ACCESS MEMORY STABILITY USING ASYMMETRIC ACCESS TRANSISTORS AND DESIGN STRUCTURE FOR SAME

STATEMENT REGARDING FEDERALLY SPONSORED RESEARCH OR DEVELOPMENT

This invention was made with Government support under contract number NBCH 3039004 awarded by the Defense Advanced Research Projects Agency (DARPA). The government has certain rights in this invention.

FIELD OF THE INVENTION

The present invention generally relates to electronic circuitry and associated design structures, and, more particularly, to electronic memory circuits and design structures for same.

BACKGROUND OF THE INVENTION

As device size shrinks down aggressively in advanced very large scale integration (VLSI) technology, increased process variation causes significant amounts of threshold voltage fluctuation. As the result, stability of static random access memory circuits (SRAMs) deteriorates due to the large threshold voltage mismatch between two neighboring transistors in a cell. The stability of the conventional 6-transistor (6-T) SRAM SRAM is dependent on the relative strengths of the various transistors in the cell. The transistors are typically optimized based on the expected device strengths to achieve the best power-performance characteristics, while maintaining the stability of the cell.

As shown in FIG. 1, the most-widely used, conventional (4-transistor (6-T) SRAM cell 100 has its worst stability during READ mode, i.e., when the word line 102 is asserted, with both the Bit-line 104 and Bit-line bar 106 being precharged high. In this condition, the voltage at the storage node which has a "0" logic value (node Q or 108) goes up during a READ cycle (with the access transistor 110 forming a resistive divider with the pull-down transistor 112. This is termed "read disturb noise"; if this increased voltage is larger than the trip voltage of the inverter (PL-NL pair formed by transistors 114, 116), the stored logic values will be flipped and data will be lost. The cell 100 also includes the right-hand inverter formed by PR-NR pair 118, 112, as well as the left-hand access device 120 and storage node 122 ($Q_b$).

The read disturb noise problem can be alleviated by weakening the strength of the access transistor's 110, 120. However, the access transistors cannot be made arbitrarily small, since they are used to store the correct value to the cell during a WRITE operation. During the WRITE operation, as shown in FIG. 2, the word line 102 is asserted, with the data to be written (in this case a logical "1") and its complementary value being asserted on the BL and $BL_b$ lines, 104, 106, respectively. If the cell 100 initially contained a value of "0" at node $Q_b$, the access device on the right side 110 needs to overpower the pull-up PMOS device 118 to write the correct value to the cell 100, and hence needs to be a strong device. Thus, there exist conflicting requirements for the strength of the access transistor 110.

SUMMARY OF THE INVENTION

Principles of the present invention provide techniques for enhanced static random access memory stability using asymmetric access transistors.

In an exemplary embodiment, according to one aspect of the invention, a memory circuit includes a plurality of bit line structures (each including a true and a complementary bit line), a plurality of word line structures intersecting the plurality of bit line structures to form a plurality of cell locations; and a plurality of cells located at the plurality of cell locations. Each of the cells includes a logical storage element, a first access transistor selectively coupling a given one of the true bit lines to the logical storage element and a second access transistor selectively coupling a corresponding given one of the complementary bit lines to the logical storage element. At least one of the first and second access transistors is configured with asymmetric current characteristics to enable independent enhancement of READ and WRITE margins.

The invention also contemplates individual cells and 6-T memory circuits in combination with processors and other circuitry. One or more embodiments of the present invention may be realized in the form of an integrated circuit. The invention yet further contemplates one or more design structures embodied in a machine readable medium, comprising circuits as set forth herein.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

One or more embodiments of the invention provide an approach to enhance the stability of memory with coupled READ and WRITE bit lines by the use of asymmetric transistors. As described above, the cause of prior art read-write conflict arises due to the following two conditions:

(a) The same transistor is used during both the read and write operations; and (b) The device current from drain-to-source is identical to the current from the source-to-drains that is the device is symmetric.

While the first condition above is unavoidable in a conventional 6-T cell, the second condition is a manifestation of the process technology and is not a mandatory requirement. It can be eliminated by implementing the access transistors using asymmetric transistors that exhibit varied characteristics from drain-to-source as opposed to source-to-drain. These asymmetric devices can be optimized to exhibit higher current from source-to-drain in comparison with the drain-to-source condition. As discussed below with regard to FIG. 3, by connecting these devices with the source terminal coupled to the storage node, and the drain terminal coupled to the bit lines, according to one or more embodiments of the invention, the above conflict condition can be alleviated and hence the cell stability can be enhanced.

Thus, one or more embodiments of the invention provide techniques for use of asymmetric MOSFETs for the access transistors configured in such a way as to enable independent optimization of READ and WRITE operations (that is, or READ and WRITE margins).

Figure 1:
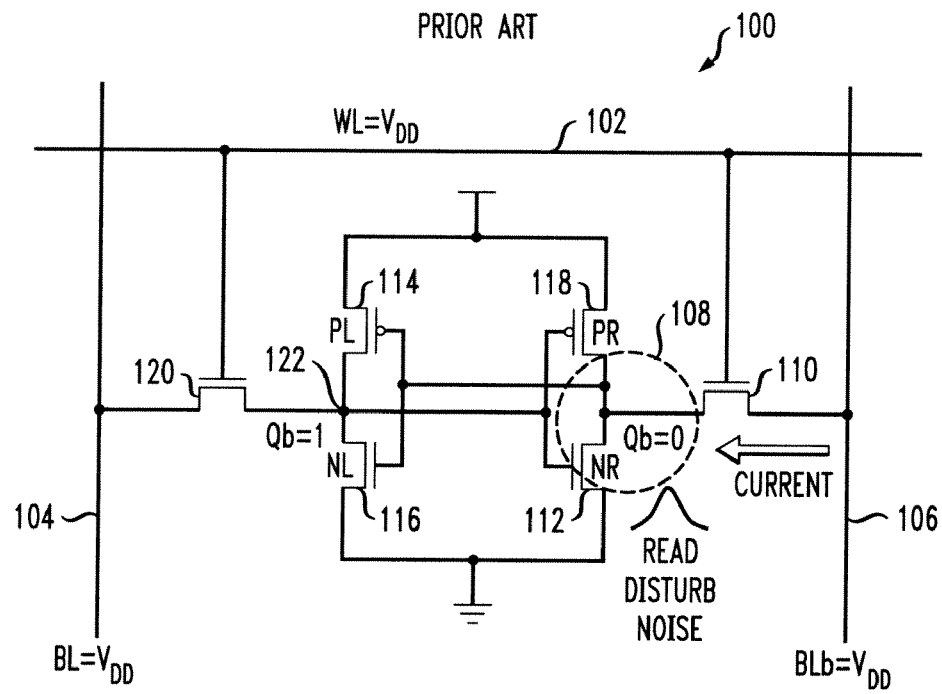
FIG. 1 shows READ disturb noise in a six-transistor (6-T) static random access memory (SRAM) cell, according to the prior art.
Figure 2:
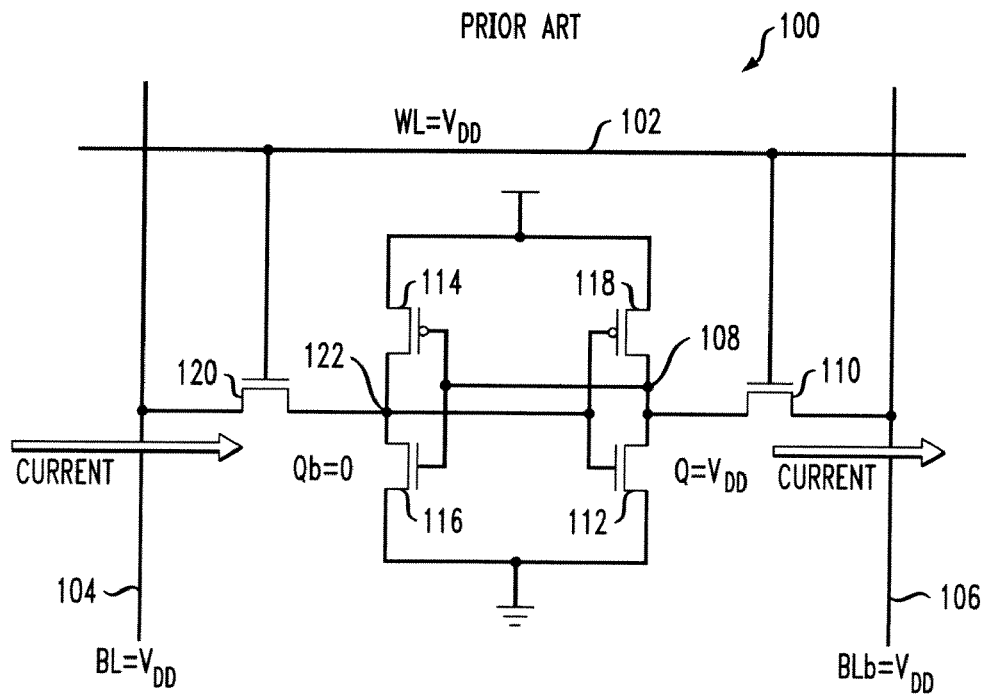
FIG. 2 shows a WRITE operation in a six-transistor (6-T) static random access memory (SRAM) cell, according to the prior art.
Figure 3:
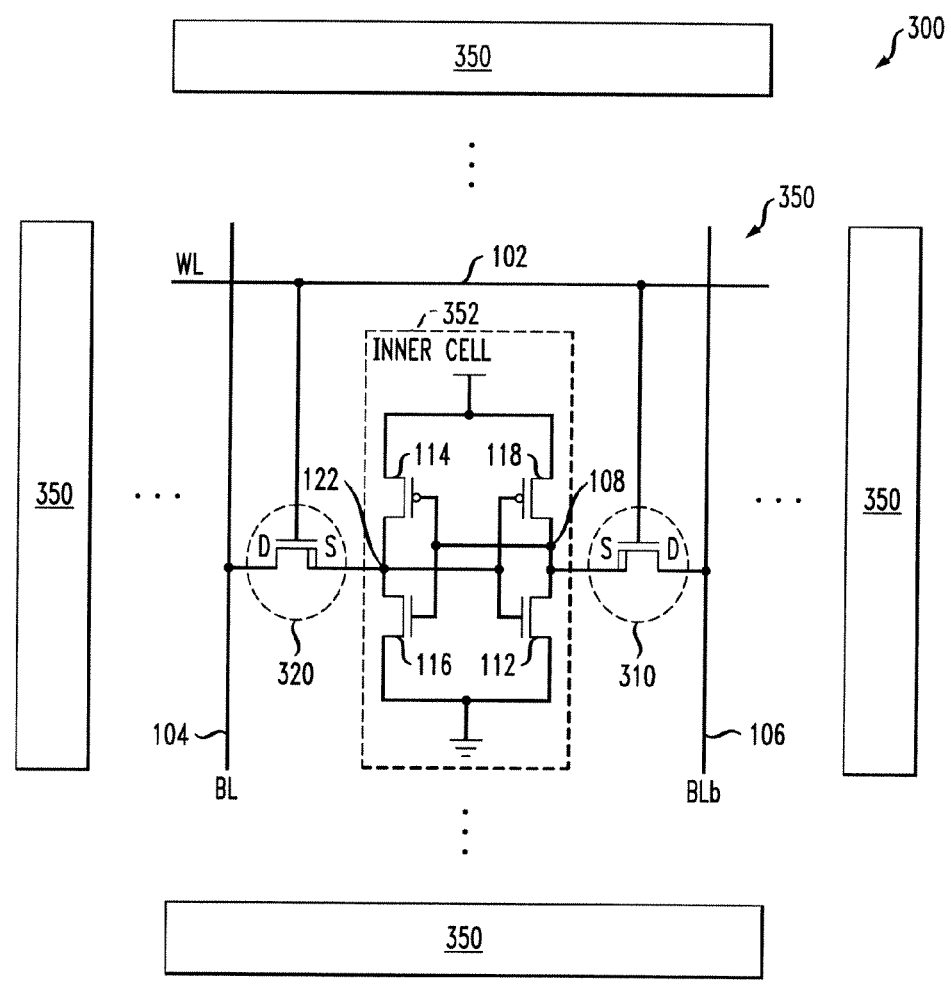
FIG. 3 shows an exemplary 6-T memory circuit employing a plurality of memory cells with asymmetric access transistors, according to an aspect of the invention.

Weak access transistor current is favored for stable READ and strong access transistor current is favored for stable WRITE in static memory cells. In the conventional 6-T SRAM, the same access transistor is used for both WRITE and READ operations, and the access transistor has the same drain-to-source current and source-to-drain current, so that it is difficult to optimize both the READ and WRITE conditions simultaneously. Referring to FIG. 3., in one or more embodiments of the invention, we use asymmetric devices for the access transistors 310, 320. These asymmetric transistors have a source-to-drain current higher than the drain-to-source current. In particular, FIG. 3 shows an exemplary memory circuit 300. Elements similar to those in FIGS. 1 and 2 have received the same reference character. The circuit includes a plurality of bit line structures, each of the bit line structures in turn including a true bit line 104 and a complementary bit line 106. The circuit also includes a plurality of word lines structures 102 intersecting the plurality of bit line structures to form a plurality of cell locations. The circuit further includes a plurality of cells 350 located at the plurality of cell locations. For illustrative convenience, only a single cell and its associated word line and bit lines are shown in detail, while the other cells are shown in block form and the SRAM array is suggested by the ellipses.

Each of the cells includes an inner cell 352 with a logical storage element. A first access transistor 320 selectively couples true bit line 104 to the logical storage element. A second access transistor 310 selectively couples complementary bit line 106 to the logical storage element. One or both of the first and second access transistors 320, 310 are configured with asymmetric current characteristics to enable independent enhancement of READ and WRITE margins. We may use just one asymmetric access device when we read from only one side, as in asymmetrical SRAM.

In some instances, the logical storage element is a storage flip-flop including a first inverter and a second inverter cross-coupled to the first inverter to form the storage flip-flop. It should be emphasized that many different configurations can be employed for the inner cell 352; the depiction of cross coupled inverters formed by transistors 114, 116 (PL and NL) and 118, 112 (PR and NR) is purely exemplary. For example, the inner cell can include conventional symmetric cross-coupled inverters, cross-coupled inverters with a mix of asymmetric transistors and symmetric transistors, asymmetric cross-coupled inverters (in which each inverter has a different trip voltage), and indeed any type of logical storage element that can benefit from asymmetric access devices as described herein. Non-limiting examples of asymmetric (inner) cells that can be employed with one or more embodiments of the invention are known to the skilled artisan from US Patent Publications 2007-0201261 A1 of Chuang et al., entitled "Independent-gate controlled asymmetrical memory cell and memory using the cell," and 2007-0236982 A1 of Chuang et al. entitled "Asymmetrical memory cells and memories using the cells," the complete disclosures of both of which are expressly incorporated herein by reference for all purposes.

In one or more embodiments, the various transistors can be MOSFETs. The sources of the first and second access transistors 320, 310 are coupled to the storage flip-flop, the drain of the first access transistor 320 is coupled to true bit line 104, and the drain of the second access transistor 310 is coupled to the complementary bit line 106.

Figure 4:
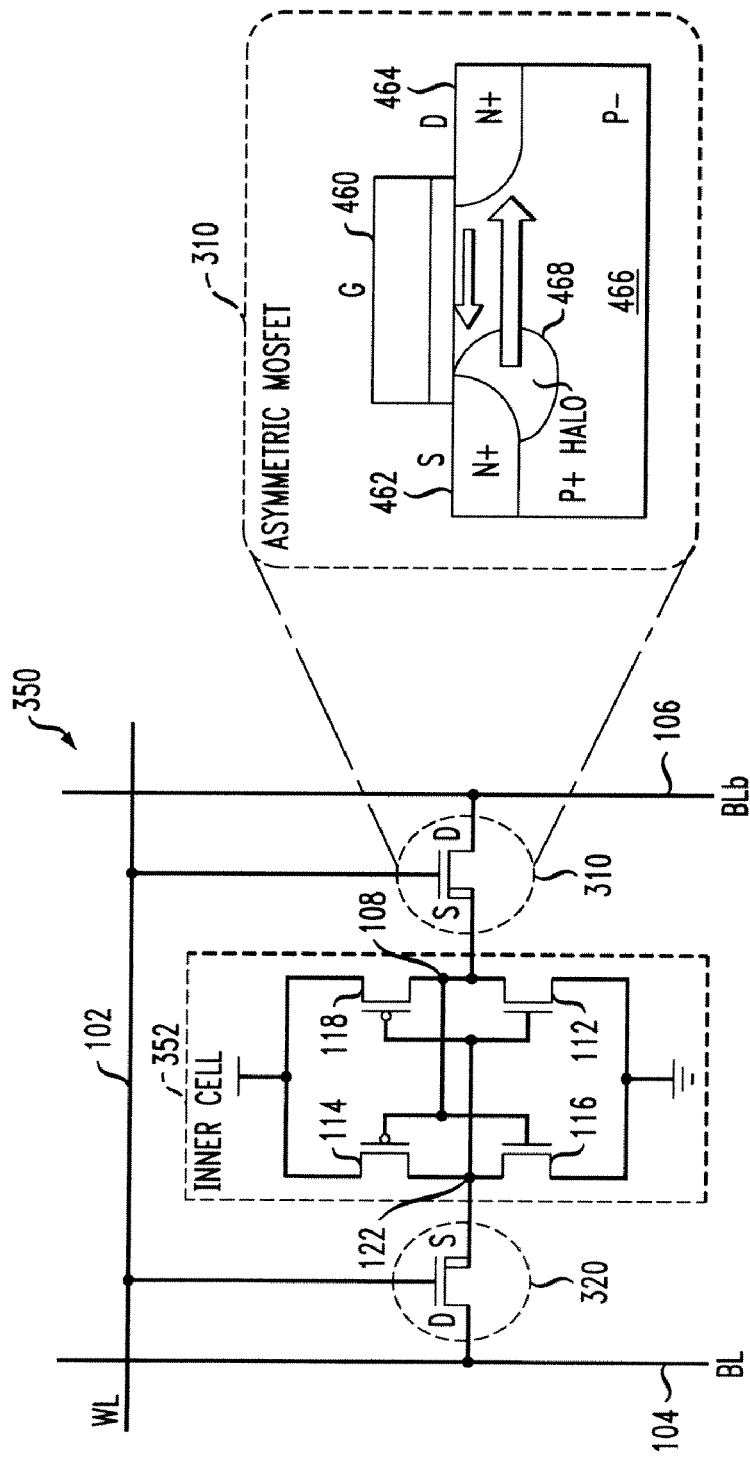
FIG. 4 shows an exemplary 6-T SRAM cell as used in the embodiment of FIG. 3, together with one possible configuration of asymmetric MOSFET access transistor.

With the use of asymmetric devices, we can use the strong current direction in the transistor for the WRITE operation while using the weak current direction for the READ operation, for better stability. FIG. 4 shows one specific detailed exemplary embodiment for the 6-T cells 350 of FIG. 3. Asymmetric access device (transistor) 310 is an asymmetric halo transistor, for purposes of illustration, it being understood that any other suitable asymmetric device can be also used. Transistor 310 includes gate 460; source 462 and drain 464, each N+ type; and P– type substrate 466. A P+ type "halo" 468 is provided adjacent the source 462. In this exemplary 6-T embodiment, the source-to-drain current is higher than the drain-to-source current (symbolized by the relative size of the current arrows), due to the higher halo doping at the source side as compared to the drain side.

As noted, one or more embodiments of the invention employ asymmetric metal oxide semiconductor field effect transistors (MOSFETs); such transistors are themselves known to the skilled artisan, who, given the teachings herein, will be able to use same to implement one or more inventive techniques. Non-limiting examples of asymmetric MOSFETs that may be used with one or more embodiments of the invention are set forth in the following publications, each of which is expressly incorporated herein by reference for all purposes: [1] T. N. Buti, S. Ogura, N. Rovedo, and K Tobimatsu, "A new asymmetrical halo source GOLD drain (HS-GOLD) deep sub-half-micrometer N-MOSFET design for reliability and performance," IEEE Trans. Electron Devices, vol. 38, no. 8, pp. 1757-1764, August 1991; [2] S. Odanaka and A. Hiroki, "Potential design and transport property of 0.1-μm MOSFET with asymmetric channel profile," IEEE Trans. Electron Devices, v. 44 n. 4, pp. 595-600, April 1997; [3] T. Ohzone, T. Miyakawa, T. Matsuda, T. Yabu, and S. Odanka, "Influence of asymmetric/symmetric source/drain region on asymmetry and mismatch of CMOSFETs and circuit performance," IEEE Trans. Electron Devices, vol. 45, no. 2, pp. 529-537, February 1998; [4] A. Akturk, N. Goldsman, and G. Metze, "Faster CMOS inverter switching obtained with channel engineered asymmetrical halo implanted MOSFETs," in Proc. Semi. Dev. Res. Symp., 2001, pp. 118-221; [5] A. Bansal and K. Roy, Asymmetric Halo CMOSFET to Reduce Static Power Dissipation With Improved Performance," IEEE Trans. Electron Devices, vol. 52, no. 3, pp. 397-405, March 2005.

Figure 5:
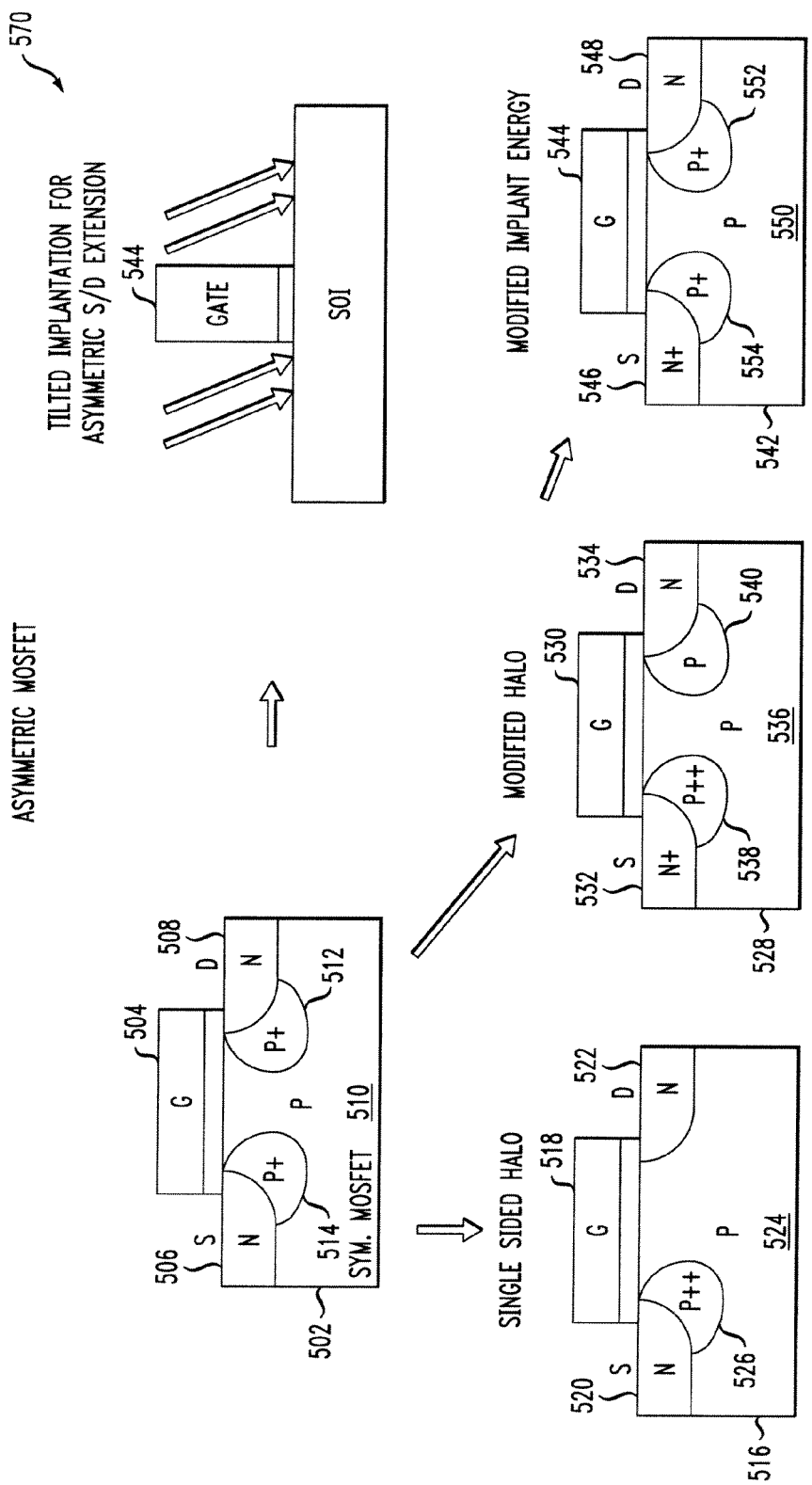
FIG. 5 shows a number of different types of asymmetric MOSFETs that may be employed with one or more embodiments of the invention.

Attention should now be given to FIG. 5, which presents non-limiting examples of asymmetric transistors that can be employed with one or more embodiments of the invention. Symmetric MOSFET 502 has gate 504, N source 506, and N drain 508 with P-type substrate 510. P+ halos 512, 514 are provided adjacent drain and source 508, 506 respectively. In the single-sided halo approach 516, gate, source, drain, and substrate 518, 520, 522, 524 are as before but only a single halo 526 is provided adjacent source 520. However, it is of P++ type. In the modified halo approach 528, gate, source, drain, and substrate 530, 532, 534, 536 are as before but halo 538 adjacent source 532 is of P++ type while halo 540 adjacent drain 534 is of P type. Finally, in the asymmetric source/drain extension approach 542, elements 544, 546, 548, 550, 552, 554 are analogous to elements 504, 506, 508, 510, 512, 514 of MOSFET 502, but tilted implantation techniques are employed in the SOI technology to achieve asymmetric source/drain extension, as shown at 570.

It will be appreciated that FIG. 5 is exemplary, and asymmetric MOSFETs for use in one or more embodiments of the invention can be realized in multiple ways. The net effect is that:

$$I(\text{drain–source}) \neq I(\text{source–drain}). \qquad \text{Eq. 1}$$

For purposes of illustration, using a single-sided halo technique for implementation of asymmetric transistors, in the reverse mode, lower doping near the source end reduces threshold voltage:

$$V_T(\text{fwd}) > V_T(\text{rev}) => I(\text{fwd}) < I(\text{rev}) \qquad \text{Eq. 2}$$

The on-current of the asymmetric transistor (in reverse mode) equals the on-current of the symmetric transistor, while the on-current of there asymmetric transistor (in the forward mode) is less that the on-current of the symmetric transistor. Note that the asymmetric transistor can also be designed to make the on-current of the asymmetric transistor (in the forward mode) equal to the on-current of the symmetric transistor (with the on-current in reverse mode being greater than that of the symmetric transistor). Throughout this document, including the claims, comparisons between asymmetric and conventional transistors are intended to apply to devices that are substantially similar in terms of materials, technology, and size, except for the indicated asymmetry.

Figure 6:
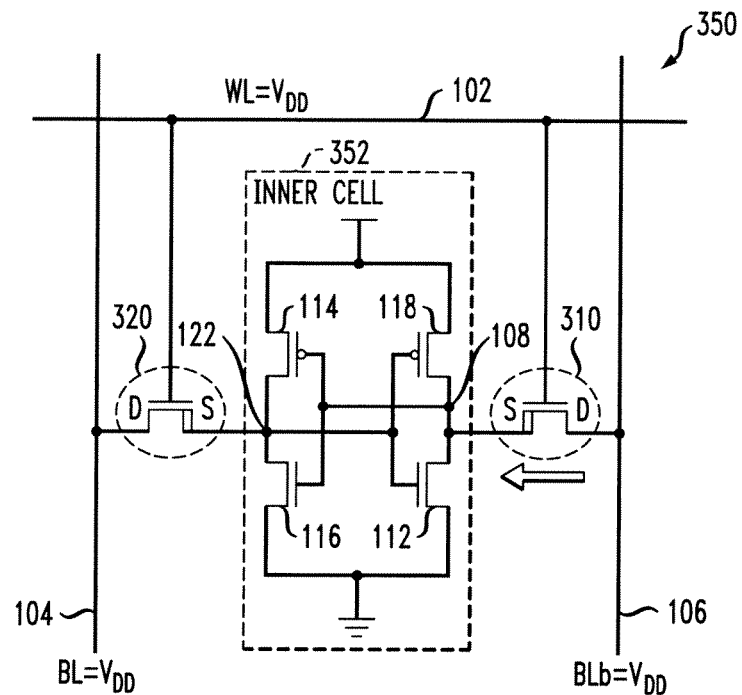
FIG. 6 shows a READ condition in the exemplary cell of FIGS. 3 and 4.
Figure 7:
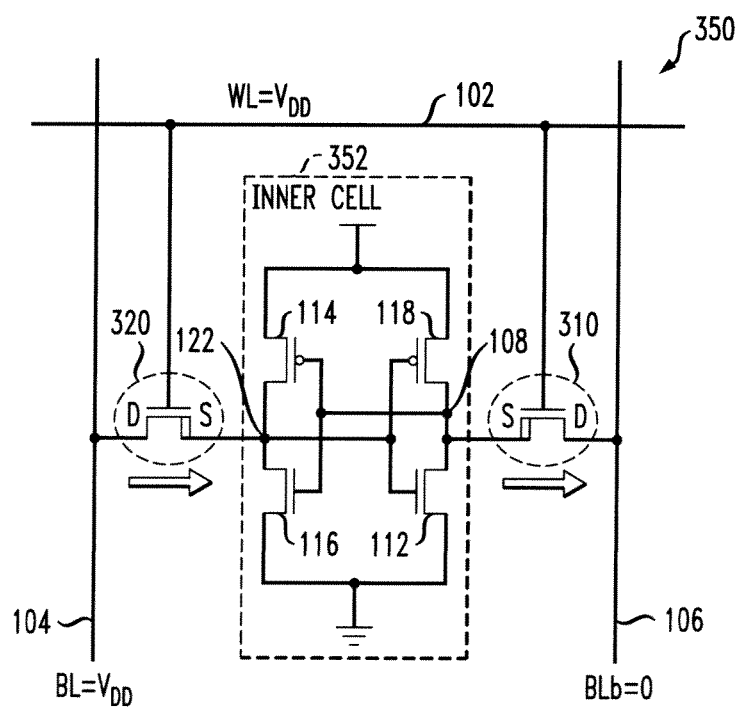
FIG. 7 shows a WRITE condition in the exemplary cell of FIGS. 3 and 4.

As shown in FIG. 6, the access transistor current flows from drain to source in the READ condition (BLb to $V_R$ (assuming $V_R$ storing 0)), and hence the current can be made smaller than that of the conventional symmetric MOSFET. On the other hand, as shown in FIG. 7, the transistor current flows from source to drain in the WRITE condition ($V_R$ to BLb assuming $V_R$ storing VDD and VBLb=0V), so that the current can be made larger than that of the conventional symmetric MOSFET. Note that the WRITE current through the access transistor 320 connecting BL and $V_L$ becomes smaller than that of the symmetric MOSFET in the same situation, but the current from the high voltage bit line to the "0" cell node does not contribute significantly to the WRITE operation, so the impact is negligible.

If we make the stronger current (source to drain current for WRITE in FIG. 4) of the asymmetric MOSFET the same as the current of the conventional symmetric MOSFET used for the access transistor, we can have improved READ stability while maintaining the same WRITE stability as compared to conventional SRAM. On the other hand, if we make the weaker READ current of the asymmetric MOSFET the same as the current of the conventional symmetric MOSFET, then we will have the stronger WRITE current and improved WRITE-ability, while having the same READ stability.

Thus, by way of review, in one or more embodiments, access transistors 310, 320 (connected such that their drain terminals are coupled to the true and complementary bit lines, and their source terminals are coupled to the storage nodes) each have a characteristic drain-to-source current and a characteristic source-to-drain current, and the characteristic source-to-drain current is higher than the characteristic drain-to-source current. The characteristic source-to-drain current can be employed for a WRITE operation and the characteristic drain-to-source current can be employed for a READ operation. In some instances, the access transistors can be configured such that the characteristics source-to-drain current employed for the WRITE operation is substantially similar to a characteristic current in a conventional transistor during a conventional WRITE operation, such that circuit obtains a weaker READ current and improved READ stability while maintaining WRITE stability comparable to that of a conventional circuit. In other instances the access transistors can be configured such that the characteristic drain-to-source current employed for the READ operation is substantially similar to a characteristic current in a conventional transistor during a conventional READ operation, whereby the circuit obtains a stronger WRITE current and improved WRITE stability with READ stability comparable to that of a conventional circuit. The access transistors can be, by way of example and not limitation, single-sided halo asymmetric MOSFETs, modified halo asymmetric MOSFETs, or modified implant energy asymmetric MOSFETs. Further, the inverters in inner cell 352 can be conventional symmetric inventers; asymmetric inverters having different trip voltages; inventers formed with at least one symmetric MOSFET and at least one asymmetric MOSFET; or inverters formed entirely with asymmetric MOSFETs.

Memory cells according to one more aspects of the present invention may be formed into memory circuits, which may be realized as integrated circuits; thus, at least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the cells described herein and may include other structures or circuits, or other types of cells. The individual die are cut or diced from the wafer, then packaged as an integrated circuit. A person of skill in the art will know how to dice wafers and package die to produce integrated circuits. Integrated circuits so manufactured are considered part of the present invention.

Circuits including cells as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design, in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

Figure 8:
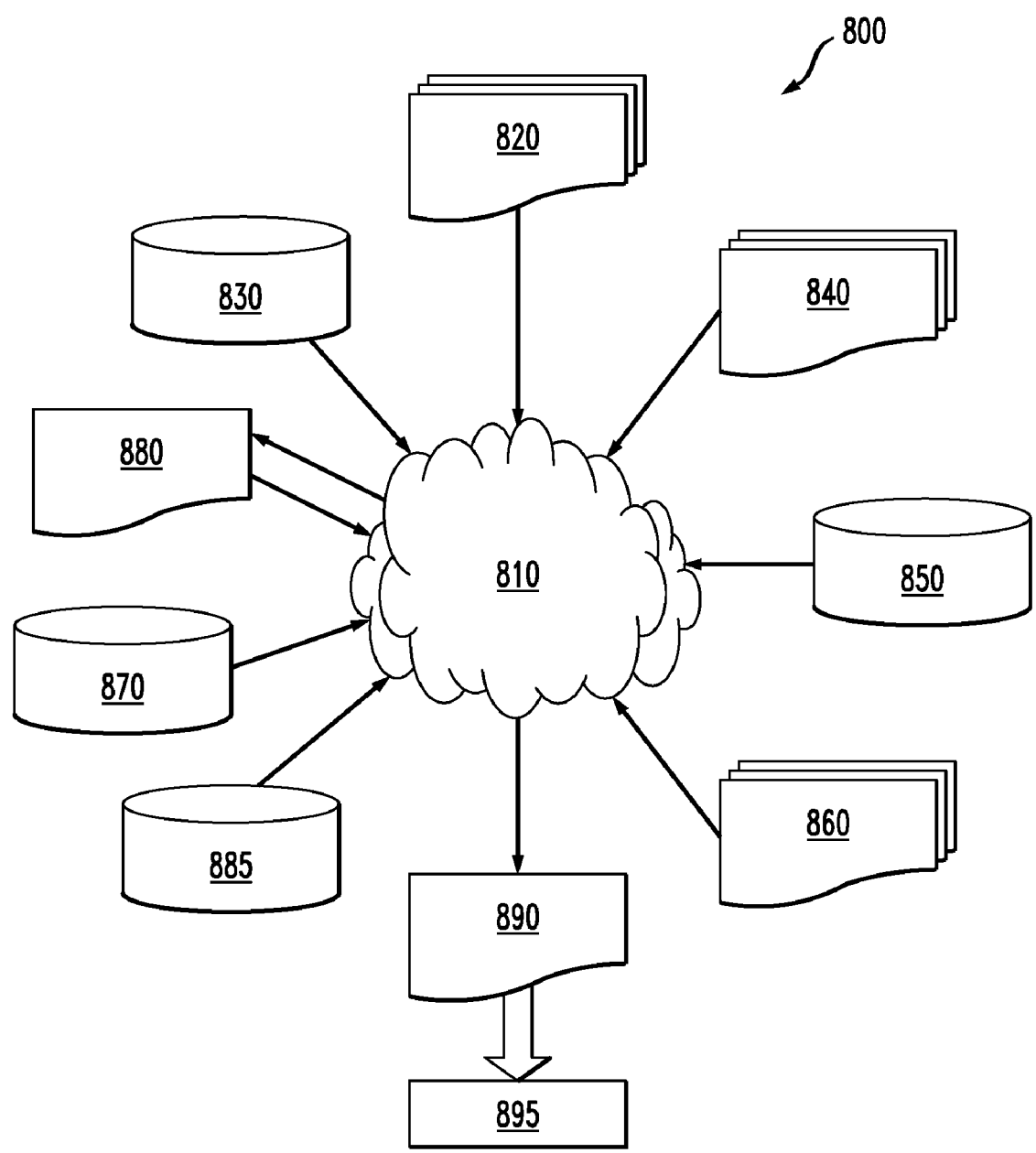
FIG. 8 is a flow diagram of a design process used in semiconductor design manufactures and/or test.

FIG. 8 shows a block diagram of an exemplary design flow 800 used for example, in semiconductor design, manufacturing, and/or test. Design flow 800 may vary depending on the type of IC being designed. For example, a design flow 800 for building an application specific IC (ASIC) may differ from a design flow 800 for designing a standard component. Design structure 820 is preferably an input to a design process 810 and may come from an IP provider, a core developer, or other design company or may be generated by the operator of the design flow, or from other sources. Design structure 820 comprises an embodiment of the invention as shown in FIGS. 3-7 in the form of schematics or HDL, a hardware-description language (e.g., Verilog, VHDL, C, etc,). Design structure 820 may be contained on one or more machine readable media. For example, design structure 820 may be a text file or a graphical representation of an embodiment of the invention as shown in FIGS. 3-7. Design process 810 preferably synthesizes (or translates) an embodiment of the invention as shown in FIGS. 3-7 into a netlist 880, where netlist 880 is, for example, a list of wires, transistors, logic gates, control circuits, I/O, models, etc. that describes the connections to other elements and circuits in an integrated circuit design and recorded on at least one machine readable medium. This may be an iterative process in which netlist 880 is resynthesized one or more times depending on design specifications and parameters for the circuit.

Design process 810 may include using a variety of inputs; for example, inputs from library elements 830 which may house a set of commonly used elements, circuits, and devices, including models, layouts, and symbolic representations, for a given manufacturing technology (e.g., different technology nodes 32 nm, 45 nm, 90 nm, etc.), design specifications 840, characterization data 850, verification data 860, design rules 870, and test data files 885 (which may include test patterns and other testing information). Design process 810 may further include, for example, standard circuit design processes such as timing analysis, verification, design rule checking, place and route operations, etc. One of ordinary skill in the art of integrated circuit design can appreciate the extent of possible electronic design automation tools and applications used in design process 810 without deviating from the scope and spirit of the invention. The design structure of the invention is not limited to any specific design flow.

Design process 810 preferably translates an embodiment of the invention as shown in FIGS. 3-7, along with any additional integrated circuit design or data (if applicable), into a second design structure 890. Design structure 890 resides on a storage medium in a data format used for the exchange of layout data of integrated circuits and/or symbolic data format (e.g., information stored in a GDSII (GDS2), GL1, OASIS, map files, or any other suitable format for storing such design structures). Design structure 890 may comprise information such as for example, symbolic data, map files, test data files, design content files, manufacturing data, layout parameters, wires, levels of metal, vias, shapes, data for routing, through the manufacturing line, and any other data required by a semiconductor manufacturer to produce an embodiment of the invention as shown in FIGS. 3-7. Design structure 890 may then proceed to a stage 895 where, for example, design structure 890; proceeds to tape-out, is released to manufacturing, is released to a mask house, is sent to another design house, is sent back to the customer, etc.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A memory circuit comprising:
   a plurality of bit line structures, each of said bit line structures comprising a true bit line and a complementary bit line;
   a plurality of word lines structures intersecting said plurality of bit line structures to form a plurality of cell locations; and
   a plurality of cells located at said plurality of cell locations, each of said cells comprising:
      a logical storage element;
      a first access transistor selectively coupling a given one of said true bit lines to said logical storage element, wherein a current from said logical storage element to said given one of said true bit lines is higher than a current from said given one of said true bit lines to said logical storage element; and
      a second access transistor selectively coupling a corresponding given one of said complementary bit lines to said logical storage element, wherein a current from said logical storage element to said corresponding given one of said complementary bit lines is higher than a current from said corresponding given one of said complementary bit lines to said logical storage element;
   wherein at least one of said first and second access transistors comprises an asymmetric access transistor configured with asymmetric current characteristics to enable independent enhancement of READ and WRITE margins.

2. The memory circuit of claim 1, wherein said logical storage element comprises a storage flip-flop, said storage flip-flop comprising:
   a first inverter; and
   a second inverter cross-coupled to said first inverter to form said storage flip-flop.

3. The memory circuit of claim 2, wherein said first and second access transistors comprise metal oxide semiconductor field effect transistors.

4. The memory circuit of claim 3, wherein each of said first and second access transistors has a drain and a source, said sources of said first and second access transistors being coupled to said storage flip-flop, said drain of said first access transistor being coupled to said given one of said true bit lines, said drain of said second access transistor being coupled to said given one of said complementary bit lines.

5. The memory circuit of claim 4, wherein said at least one asymmetric access transistor has a characteristic drain-to-source current and a characteristic source-to-drain current, and wherein said characteristic source-to-drain current is higher than said characteristic drain-to-source current.

6. The memory circuit of claim 5, wherein said characteristic source-to-drain current is employed for a WRITE operation and wherein said characteristic drain-to-source current is employed for a READ operation.

7. The memory circuit of claim 6, wherein said at least one asymmetric access transistor is configured such that said characteristic source-to-drain current employed for said WRITE operation maintains WRITE stability during a WRITE operation, whereby said circuit obtains a weaker READ current and improved READ stability while maintaining said WRITE stability.

8. The memory circuit of claim 6, wherein said at least one asymmetric access transistor is configured such that said characteristic drain-to-source current employed for said READ operation maintains READ stability during a READ operation, whereby said circuit obtains a stronger WRITE current and improved WRITE stability while maintaining said READ stability.

9. The memory circuit of claim 6, wherein said at least one asymmetric access transistor comprises a single-sided halo asymmetric metal oxide semiconductor field effect transistor.

10. The memory circuit of claim 6, wherein said at least one asymmetric access transistor comprises a modified halo asymmetric metal oxide semiconductor field effect transistor.

11. The memory circuit of claim 6, wherein said at least one asymmetric access transistor comprises a modified implant energy asymmetric metal oxide semiconductor field effect transistor.

12. The memory circuit of claim 2, wherein said inverters comprise conventional symmetric inverters and wherein both of said access transistors are configured with said asymmetric current characteristics to enable independent enhancement of READ and WRITE margins.

13. The memory circuit of claim 2, wherein said inverters comprise asymmetric inverters, said first inverter having a first inverter trip voltage, said second inverter having a second inverter trip voltage different than said first inverter trip voltage.

14. The memory circuit of claim 2, wherein said inverters are formed with at least one symmetric metal oxide semiconductor field effect transistor and at least one asymmetric metal oxide semiconductor field effect transistor.

15. The memory circuit of claim 2, wherein said inverters are formed entirely with asymmetric metal oxide semiconductor field effect transistors.

* * * * *